(12) United States Patent
Prabhakar et al.

(10) Patent No.: US 9,854,695 B1
(45) Date of Patent: Dec. 26, 2017

(54) SINGLE RACK UNIT STORAGE BLADE WITH REDUNDANT CONTROLLERS

(71) Applicant: Cisco Technology, Inc., San Jose, CA (US)

(72) Inventors: Aditya Prabhakar, San Mateo, CA (US); Glenn Charest, San Jose, CA (US); Brian John Cardanha, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/869,108

(22) Filed: Sep. 29, 2015

(51) Int. Cl.
    *H05K 7/14* (2006.01)
(52) U.S. Cl.
    CPC ......... *H05K 7/1487* (2013.01); *H05K 7/1489* (2013.01)
(58) Field of Classification Search
    CPC ....... G06F 1/181; G06F 1/187; H05K 7/1485; H05K 7/1487; H05K 7/1488; H05K 7/1489; H05K 7/1494
    USPC .................................................. 361/724–727
    See application file for complete search history.

(56) References Cited

U.S. PATENT DOCUMENTS

| | | | |
|---|---|---|---|
| 6,392,884 B1 | 5/2002 | Chou | |
| 6,621,693 B1 | 9/2003 | Potter et al. | |
| 6,768,638 B2 | 7/2004 | Shih | |
| 6,853,548 B2 * | 2/2005 | Vanderheyden | G11B 33/128 361/679.02 |
| 7,349,204 B2 | 3/2008 | Tanaka et al. | |
| 7,362,572 B1 | 4/2008 | Wierzbicki et al. | |
| 7,486,526 B1 | 2/2009 | Frangioso, Jr. et al. | |
| 7,983,032 B2 * | 7/2011 | Walker | G06F 1/187 312/223.2 |
| 8,508,928 B2 * | 8/2013 | Killen | G11B 33/124 361/679.33 |
| 2002/0144044 A1 * | 10/2002 | Moon | G06F 3/0607 710/302 |
| 2003/0011976 A1 * | 1/2003 | Treiber | G06F 1/181 361/727 |
| 2003/0030975 A1 * | 2/2003 | Bestwick | G06F 1/183 361/679.51 |
| 2003/0223193 A1 * | 12/2003 | Smith | H05K 7/1488 361/679.48 |
| 2004/0130865 A1 | 7/2004 | Vanderheyden et al. | |
| 2005/0021606 A1 * | 1/2005 | Davies | G06F 11/1456 709/203 |

(Continued)

OTHER PUBLICATIONS

"QuickSpecs HP D2220sb Storage Blade" Hewlett-Packard, c04111399-DA-14507 Worldwide—Version 10—Jun. 5, 2015, 19 pages.

*Primary Examiner* — Adrian S Wilson
(74) *Attorney, Agent, or Firm* — Edell, Shapiro & Finnan, LLC (57) ABSTRACT

A storage blade apparatus includes a blade housing, a first drive drawer, a second drive drawer, and at least first and second redundant controllers. The first drive drawer is included in the blade housing and includes a first set of drive bays. The second drive drawer is included in the blade housing and includes a second set of drive bays. The first and second redundant controllers are contained within the blade housing and each of the first and second redundant controllers is operably connected to each of the first set of drive bays and each of the second set of drive bays. The blade housing is configured to fit within a blade slot of a chassis.

20 Claims, 7 Drawing Sheets

(56) References Cited

U.S. PATENT DOCUMENTS

| | | | | |
|---|---|---|---|---|
| 2005/0207134 A1* | 9/2005 | Belady | ............... | H05K 1/14 361/796 |
| 2005/0219826 A1* | 10/2005 | Carlson | ............... | G11B 33/128 361/724 |
| 2005/0257232 A1* | 11/2005 | Hidaka | ............... | G11B 33/126 720/654 |
| 2006/0050487 A1* | 3/2006 | Wu | ............... | G06F 1/184 361/724 |
| 2007/0247805 A1* | 10/2007 | Fujie | ............... | G11B 33/12 361/679.49 |
| 2007/0253157 A1* | 11/2007 | Atkins | ............... | G06F 1/184 361/679.33 |
| 2008/0037218 A1* | 2/2008 | Sharma | ............... | H05K 7/1424 361/695 |
| 2009/0257187 A1* | 10/2009 | Mills | ............... | H05K 7/20727 361/679.33 |
| 2010/0172083 A1* | 7/2010 | Randall | ............... | G11B 33/126 361/679.31 |
| 2010/0271766 A1* | 10/2010 | Lin | ............... | H05K 7/1487 361/679.02 |
| 2011/0235262 A1* | 9/2011 | Cheng | ............... | G06F 1/20 361/679.33 |
| 2011/0261526 A1* | 10/2011 | Atkins | ............... | G06F 1/187 361/679.33 |
| 2011/0267761 A1* | 11/2011 | Peng | ............... | G11B 33/128 361/679.31 |
| 2011/0310550 A1* | 12/2011 | Xu | ............... | G06F 1/20 361/679.33 |
| 2012/0075795 A1* | 3/2012 | Petruzzo | ............... | G06F 1/181 361/679.48 |
| 2012/0106070 A1* | 5/2012 | Landon | ............... | G06F 1/183 361/679.47 |
| 2012/0127648 A1* | 5/2012 | Randall | ............... | G11B 33/126 361/679.31 |
| 2012/0243160 A1* | 9/2012 | Nguyen | ............... | G06F 1/181 361/679.08 |
| 2014/0268536 A1 | 9/2014 | Herman et al. | | |
| 2015/0181748 A1 | 6/2015 | Bailey et al. | | |

\* cited by examiner

SINGLE RACK UNIT STORAGE BLADE WITH REDUNDANT CONTROLLERS

TECHNICAL FIELD

The present disclosure relates to storage blades.

BACKGROUND

Advances in server technology have created a number of different server form factor options. One of the more popular form factors is a blade form factor. A blade server offers a modular design that reduces power and physical space requirements, at least compared to rack-mount servers. Blade servers may be arranged in a blade enclosure or chassis that may be configured to provide a group of services, including power, cooling, network, and other non-core computing services, to any blade servers therein. The blade enclosure may also house additional blades in order to provide additional services, such as switching, routing, storage, and other such services to entities utilizing the services of the blade enclosure.

BRIEF DESCRIPTION OF THE DRAWINGS

Like reference numerals have been used to identify like elements throughout this disclosure.

DESCRIPTION OF EXAMPLE EMBODIMENTS

Overview

A storage blade with redundant controllers is provided. According to at least one example embodiment, a storage blade apparatus includes a blade housing configured to fit within a single blade slot of a chassis. The storage blade also includes a first drive drawer, a second drive drawer, and at least first and second redundant controllers. The first drive drawer is included in the blade housing and includes a first set of drive bays. The second drive drawer is included in the blade housing and includes a second set of drive bays. The first and second redundant controllers are contained within the blade housing and each of the first and second redundant controllers is operably connected to each of the drive bays included in the first set of drive bays and each of the drive bays included in the second set of drive bays.

EXAMPLE EMBODIMENTS

Presented herein is a storage blade for use in a blade chassis that fits into a single rack unit (1U) form-factor and provides enterprise class reliability. In order to provide enterprise class reliability, the storage blade includes redundant controllers. The storage blade may also include hot-serviceable media and other design parameters, such as power limitations and memory parameters, to provide enterprise class reliability. The storage blade presented herein may be compatible with a wide variety of blade chasses, such as the Cisco Systems, Inc. Unified Computing System (UCS) blade chassis. The storage blade includes movable drive drawers and each of the drive drawers includes a number of drive bays. The drive bays included in the movable drive drawers are each configured to support a media drive, such as a hard disk drive (HDD), a solid state drive (SSD), or a hybrid drive. For example, the storage blade may include two drive drawers that each includes eight drive bays, such that the storage blade is configured to support 16 media drives in total. Due to the architecture of the storage blade presented herein, the storage blade may offer direct attached storage to any servers installed in a blade enclosure with the storage blade.

In order to describe the storage blade presented herein, terms such as "left," "right," "top," "bottom," "front," "rear," "side," "height," "length," "width," "upper," "lower," "interior," "exterior," "inner," "outer," "depth," and the like as may be used. However, it is to be understood that these terms merely describe points of reference and do not limit the present invention to any particular orientation or configuration. For example, the terms "height," "width," and "depth" may be used to describe certain embodiments presented herein, but it is to be understood that these terms are not intended to limit the storage blade presented herein to a storage blade that can only be installed into a blade chassis in a single orientation. Instead, the storage blades presented herein may be oriented vertically, horizontally, or in any other manner when installed into a blade chassis/enclosure. Thus, even if a certain dimension is described herein as a "height," it may be understood that this dimension may provide a width or depth when the storage blade is moved to different orientations.

Figure 1:
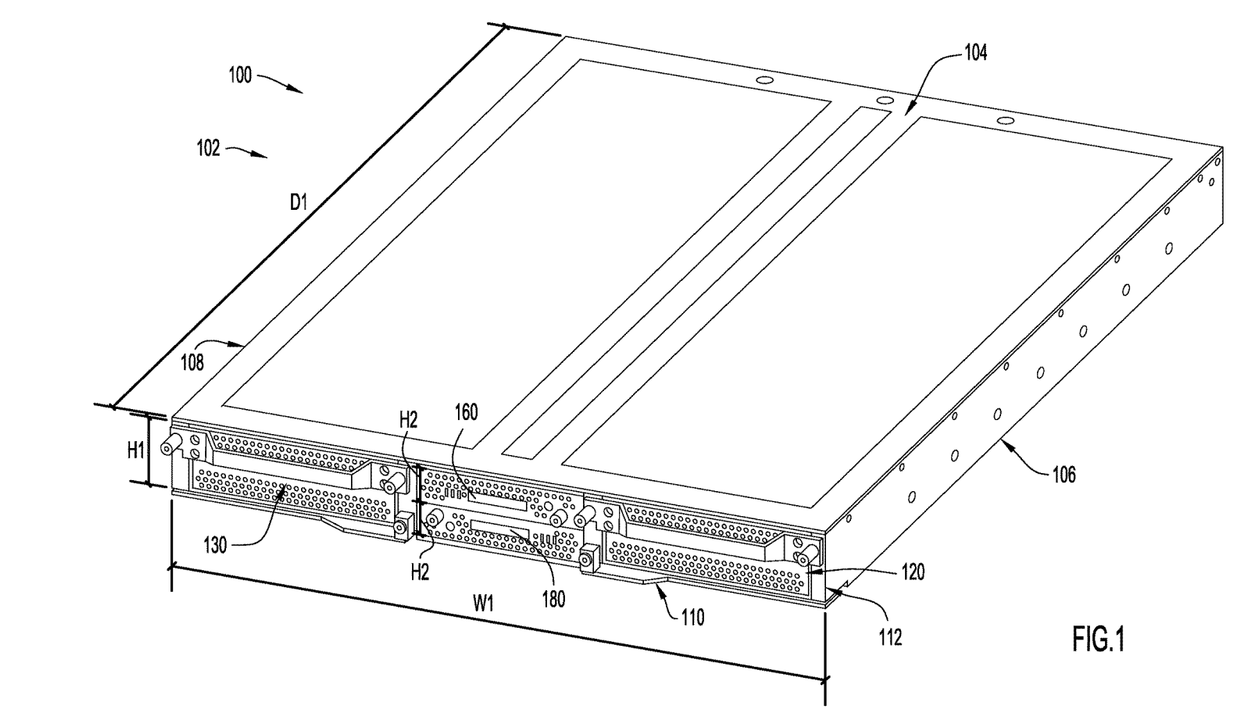
FIG. 1 illustrates a front perspective view of a storage blade with redundant controllers, according to an example embodiment

Reference is first made to FIG. 1, which illustrates an example embodiment of a storage blade 100 from a top perspective view. The blade 100 includes a blade housing 102 which includes external dimensions configured to fit into a 1U form factor slot of a blade enclosure/chassis (as is shown and described in more detail below with regards to FIG. 7). In the depicted embodiment, the blade housing 102 is substantially annular and includes a top 104, a first side 106, a second side 108, and a bottom 110 that extend around an internal cavity 112. The housing 102 does not include a front or back such that the internal cavity 112, as well as any components stored therein, are accessible from both the front and back of the housing 102. For example, components included in a chassis may access the internal components of the storage blade 100 via the open back of the blade 100 in order to operatively couple the storage blade 100 to the chassis when the storage blade 100 is inserted into a slot included in the chassis (perhaps in the manner shown and described below with respect to FIG. 7). Similarly, the components stored in the cavity 112 may be accessible by a user via the open front, even when the storage blade 100 is stored in a chassis. However, in other embodiments, the housing 102 may also include a front and/or back, or at least portions of a front and a back, and still provide the aforementioned access and/or couplings.

Still referring to FIG. 1, the internal cavity 112 includes a height H1, a width W1, and a depth D1 and is configured to support a number of components therein. Specifically, the internal cavity 112 movably supports a first drive drawer 120 and a second drive drawer 130 while statically supporting a pair of redundant controllers, including a first controller 160 and a second controller 180. In some embodiments, the first controller 160 and second controller 180 are stacked on top of each other and disposed between the first drive drawer 120 and second drive drawer 130. Positioning the controllers 160, 180 between the drive drawers 120, 130 may shorten and/or simplify any wiring or connections that must extend between these components. In some embodiments, the second controller 160 may be inverted and stacked on top of the first controller 180 to facilitate heat dissipation of both controllers 160, 180 and to further simplify and/or shorten any connections between the first controller 160, the second controller 180, the first drive drawer 120, and the second drive drawer 130. In other embodiments, the first controller 160 and the second controller 180 may be disposed beside each other or stacked adjacent a side 106, 108 of the housing 102; however, arranging the controllers 160, 180 in one of these configurations may decrease the storage capacity and/or accessibility provided by the storage blade 100.

Figure 2:
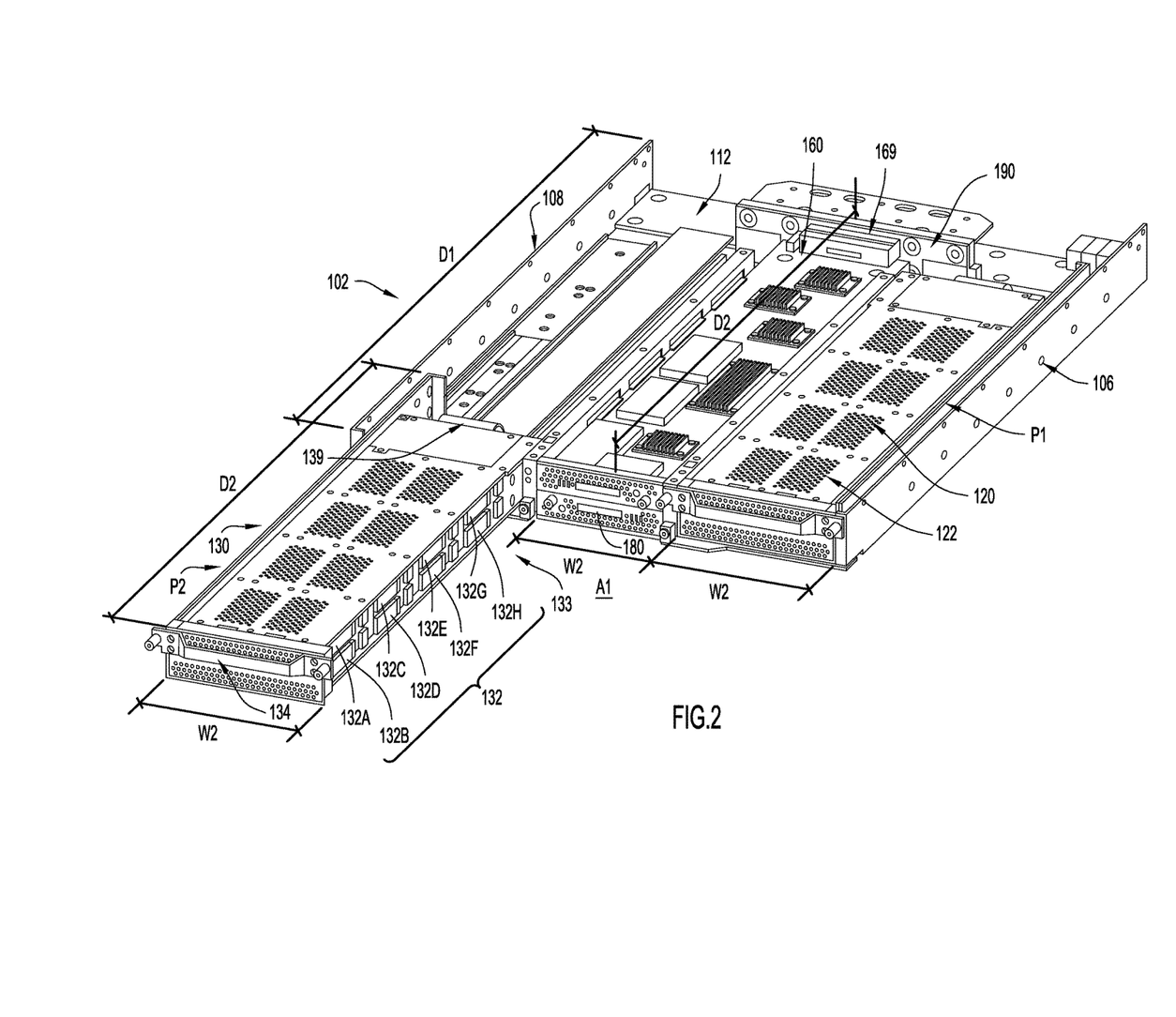
FIG. 2 illustrates a top perspective sectional view of the storage blade of FIG. 1 with a storage drawer in an extended position.

Now referring to FIGS. 1 and 2, the controllers 160, 180 each have a height H2 that is approximately half of the height H1 of the internal cavity 112 such that the collective height of the controllers 160, 180 spans the height H1 of the internal cavity 112. Thus, when installed into a chassis, each of the controllers 160, 180 may appear as a half blade to the chassis. When the when the first controller 160 and second controller 180 are disposed in a stacked configuration, the collective width of the controllers 160, 180 and the drive drawers 130, 140 spans the width W1 of the internal cavity 112. For example, the pair of controllers 160, 180, the first drive drawer 120, and the second drive drawer 130 may each have a width W2 that spans approximately one-third of the width W1 of the housing 102, as shown in FIG. 2.

Now referring to FIG. 2, but with continued reference to FIG. 1, the storage blade 100 is shown from a top perspective view with the top 104 removed. In some embodiments, the pair of controllers 160, 180, the first drive drawer 120, and the second drive drawer 130 may also span the depth D1 of the housing 102; however, in the depicted embodiment, the pair of controllers 160, 180, the first drive drawer 120, and the second drive drawer 130 each include a depth D2 that spans a portion of the housing 102. More specifically, depth D2 extends from a front end of the housing 102 to an interface board 190 included proximate the back end of the housing 102. The interface board 190 operatively couples the pair of controllers 160, 180 to the first drive drawer 120 and the second drive drawer 130 and also operatively couples the storage blade 100 to a chassis when the storage blade 100 is inserted into a slot of a blade chassis. More specifically, each of the drive drawers 120, 130 may include a backplane 139, the controllers 160, 180 may include one or more interface centerplanes 169 (i.e., one per controller 160, 180 or one for both controllers 160, 180) and each of the backplanes 139 and the centerplanes 169 may be operatively coupled to the interface board 190 in order to operatively couple the controllers 160, 180 to drive drawer 120 and drive drawer 130.

Still referring to FIG. 2, the first drive drawer 120 is in an inserted position P1 and the second drive drawer 130 is in an extend position P2. Although drive drawer 120 and drive drawer 130 are shown in different positions, each of the drive drawers 120, 130 are individually movable between an inserted position P1 and an extended position P2. By comparison, the controllers 160, 180 may be fixed within the housing 102. In some embodiments, the drive drawers 120, 130 are slidable with respect to the housing 102 in order to move between the inserted position P1 and the extended position P2. For example, the drive drawers 120, 130 may include wheels, guides, or other such features that allow the drive drawers 120, 130 to ride on a track provided on the sides 106, 108 of the housing 102. Additionally or alternatively, the drive drawers 120, 130 may be movably coupled to the pair of controllers 160, 180. In yet other embodiments, the drive drawers 120, 130 may be movable in any manner with respect to the housing 102, provided that the drive drawers 120, 130 allow for easy insertion and extraction, and provide full access to all drives within said drawer when in the extended position P2. Each drive drawer 120, 130 may also include a handle 134 to allow a user to easily grasp the drive drawers 120, 130 when moving the drive drawers 120, 130 between the extended position P2 and inserted position P1.

As seen in FIG. 2, when the drive drawers 120, 130 are inserted position P1, the drive drawers 120, 130 are disposed within the internal cavity 112 of the housing 102. By comparison, the drive drawers 120, 130 extend at least partially out of the internal cavity 112 when in the extended position P2. Regardless of whether the drive drawers 120, 130 are in the inserted position P1, the extended position P2, or a position therebetween, the drive drawers 120, 130 remain operatively coupled to the controllers 160, 180. In some embodiments, the drive drawers 120, 130 are coupled to the controllers 160, 180 via the interface board 190 and are continuously coupled to the interface board 190 via spoolable wiring, cabling, ribbon, etc. One example mechanism configured to selectively spool (or unspool) electrical ribbon that operatively couples the drive drawers 120, 130 to the interface board 190 is described below with respect to FIG. 4. However, in other embodiments, the drive drawers 120, 130 may be operatively coupled to the controllers 160, 180 in any manner that ensures the drive drawers 120, 130 remain operatively coupled to the controllers 160, 180 while in position P1, in position P2, and moving therebetween.

Figure 3:
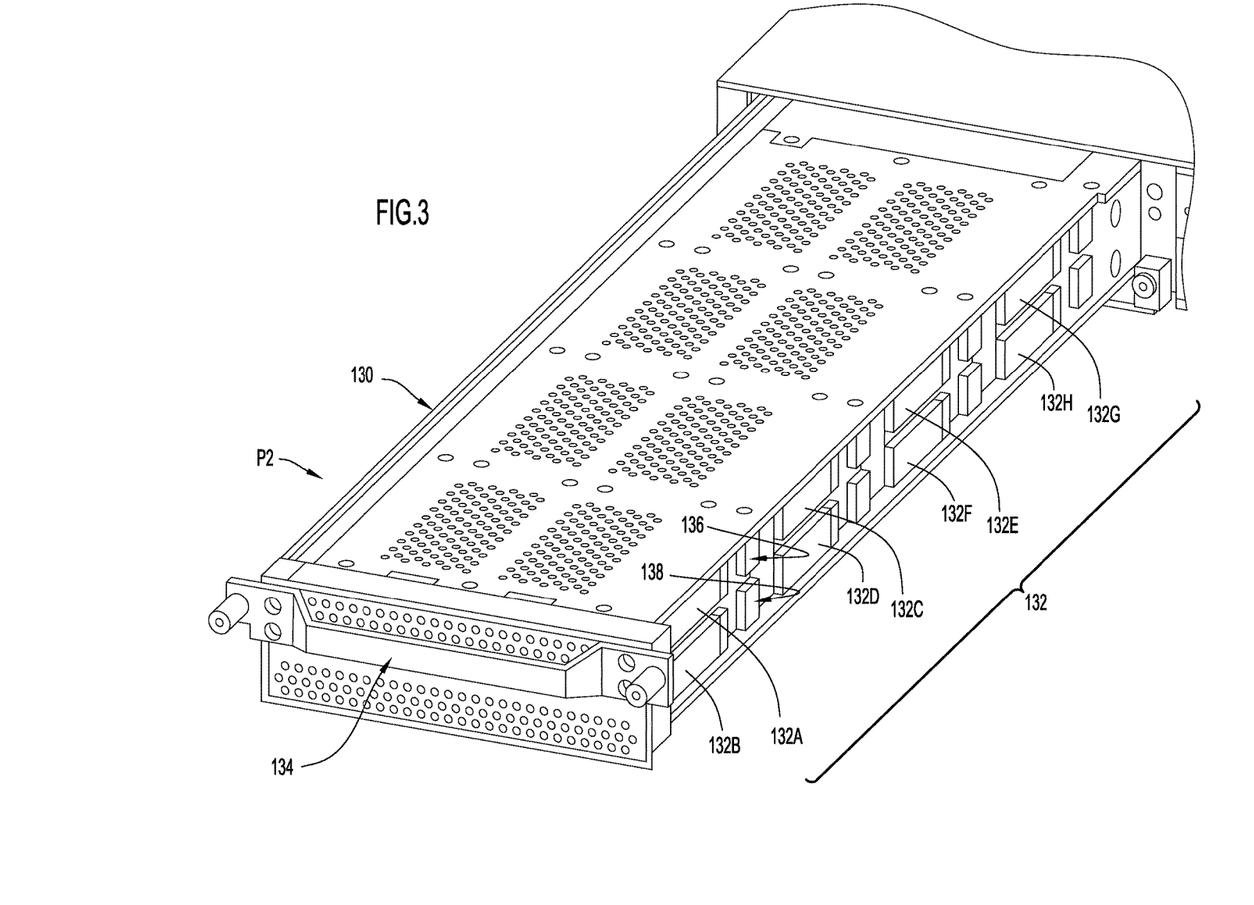
FIG. 3 illustrates a side perspective view of the storage drawer of FIG. 3.

Now referring to FIG. 3 with continued reference to FIG. 2, the first drive drawer 120 includes a first set of drive bays 122 (the vents of which are shown in FIG. 2) and second drive drawer 130 includes a second set of drive bays 132. The second set of drive bays 132 are accessible because the first drive drawer 130 is in the extended position P2 and the second set of drive bays 122 are inaccessible because the first drive drawer 120 is in the inserted position P1, insofar as the term accessible, when used herein, is only intended to denote the ability to insert or remove a drive from a drive bay and is not intended to imply that the connection with controllers 160, 180 is affected. In the depicted embodiment, the first drive drawer 120 and the second drive drawer 130 are mirrored versions of each other and, thus, for simplicity and clarity, the second set of drive bays 132 are described herein and any description of the second set of drive bays 132 is intended to be representative of both the first set of drive bays 122 and second set of drive bays 132. However, this description is not intended to be limiting and in other embodiments, the first set of drive bays 122 may differ from the second set of drive bays 132 in size, number, arrangement, or any other manner.

The second set of drive bays 132 includes eight bays, including bays 132A-132H. In this embodiment, the bays 132A-H are arranged in a two by four grid along an inner side 133 of the drive drawer, such that each bay 132A-132H is adjacent the controllers 160, 180 when in the inserted position P1 and accessible from an area A1 in front of the controllers 160, 180 when in the extended position P2, such that any drives installed within the drives 132A-132H are physically accessible, such as for service. In fact, moving the drive drawer 130 to the extended position P2 moves all of the drive bays 132A-132H included in the drive drawer 130 to an accessible position, such that all eight drive bays 132A-132H are accessible when the drive drawer 130 is in the extended position P2. Providing the drive bays 132A-132H on the inner side 133 of the drive drawer 130 may ensure that drives can be removed from the drive bays 132A-132H without having to access space beyond the width W1 of the housing 102. This may ensure that drive extraction/insertion does not protrude beyond the form factor of the blade 100 and may prevent interference with rack doors, covers, and other such infrastructure included on a blade chassis or other blade components installed in a blade chassis. In some embodiments, the bays 132A-132H are each configured to be accessible without removing any blocking devices, including chassis-based blocking devices, like removable bezels.

As seen best in FIG. 3, each bay 132A-132H may include an indicator light 136 and port 138. The indicator light 136 may indicate the status of a drive installed therein and the port 138 may provide direct external access to a drive installed within a bay 132A-132H. As an example, in some embodiments, each bay 132A-132H may include a light-emitting diode (LED) indicator configured to show drive activity (i.e., flashing in a first color), drive faults (i.e., constant second color). In some embodiments, the drive bays 132A-132H provide support for a maximum of eight 2.5 inch drives, such as Serial Advanced Technology Attachment (SATA) small form factor (SFF) drives. In some embodiments, the drive bays 132A-132H only support SSD, but in other embodiments, the drive bays 132A-132H may support any type of drive. Regardless of the type of drives supported by the drive bays 132A-132H, drives can be hot plugged or hot swapped from the drive bays 132A-132H without impacting the electrical stability of the storage blade 100 or the integrity of the controllers 160, 180. Moreover, the controllers 160, 180 may include software for redundant array of independent disks (RAID) support for any drives installed in the drive bays 132A-132H. Regardless of the technology or features included in or provided to the drive bays 132A-132H, each of the drive bays 132A-132H is configured to allow easy insertion and removal of drives.

Although not shown, in some embodiments, the storage blade 100 may include or be coupled to an external LED board with LEDs representative of all drives installed in the first and second sets of drive bays 122, 132. The external LED board may be disposed on an outer surface of the storage blade 100 or an outer surface of a chassis that the storage blade is installed in, such that the status of the drives installed in the drive bays 132A-H can be determined without opening a drive drawer 120, 130 (i.e., without moving a drive drawer 120, 130 to its extended position P2). The LED board may include fault and activity indicators for all drives installed in the drive bays (i.e. bays 132A-132H) of at least one drawer 120, 130 and, in some embodiments, the LED board may include indicators for all drives installed in the storage blade 100. Moreover, in some embodiments, the drive drawers 120, 130 may each included a microcontroller to drive the LEDs (fault and activity) for every drive in the storage blade 100. The LEDs are driven based on serial general purpose input output (SGPIO) information from both controllers 160, 180, which may indicate which drives are mapped to which controllers 160, 180 for the microcontroller.

Figure 4:
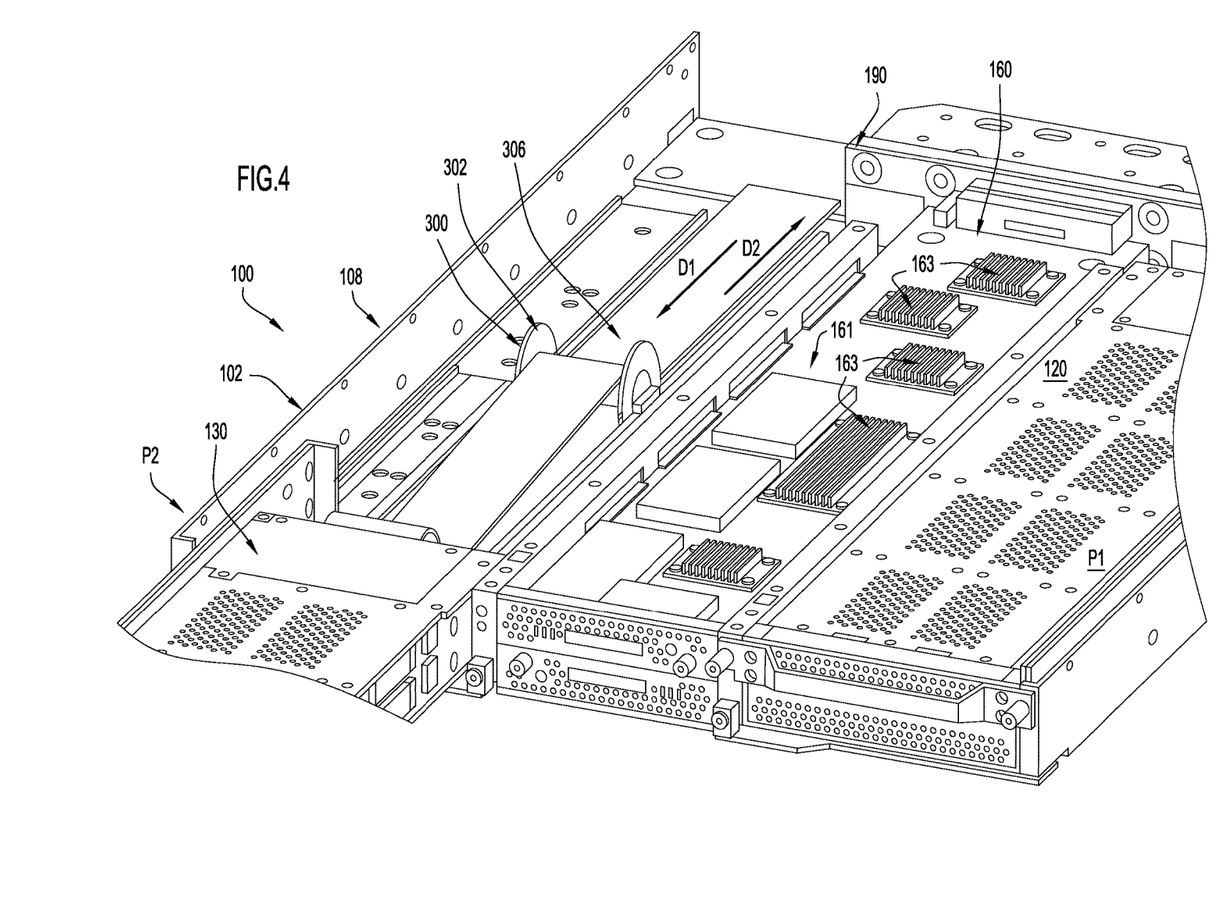
FIG. 4 illustrates a top perspective view of a portion of the storage drawer of FIG. 1, including a connection mechanism, according to an example embodiment.

Now referring to FIG. 4, an example mechanism 300 configured to operatively couple the drive drawers 120, 130 (i.e., via backplanes included on the drawers 120, 130) to the controllers 160, 180 via the interface board 190 is shown coupling the second drive drawer 130 to the controllers 160, 180. Although the mechanism 300 is only shown coupling the second drive drawer 130 to the controllers 160, 180, the mechanism 300 can also be used to couple the first drive drawer 120 to the controllers 160, 180 via the interface board 190 and, thus, is described as such. The mechanism 300 includes a spool 302 that is movably mounted to the housing 102. In some embodiments, the spool 302 rides between two rails or bumpers, but in other embodiments, the spool 302 may be movably mounted to housing 102 in any manner. The mechanism 300 also includes an electrical ribbon 306 that can be selectively spooled, wound, wrapped, or otherwise moved around the spool 302 while operatively coupling one of the drive drawers 120, 130 to the interface board 190. More specifically, as the drive drawer 120, 130 moves to its extended position P2, the ribbon 306 unwinds from the spool 302 and the spool moves in direction D1, until the ribbon 306 is fully unwound, as shown in FIG. 4. Then, as the drive drawer 120, 130 is moved back to its inserted position P1, the spool 302 will move in direction D2 while winding the ribbon 306 around the spool 302 until the ribbon 306 is fully wound. This coordinated movement prevents the ribbon from tangling or otherwise malfunctioning and keeps one of the drive drawers 120, 130 operatively coupled to the controllers 160, 180 as the drive drawer 120, 130 moves in and out of the housing 102 between the inserted position P1 and the extended position P2.

Figure 5:
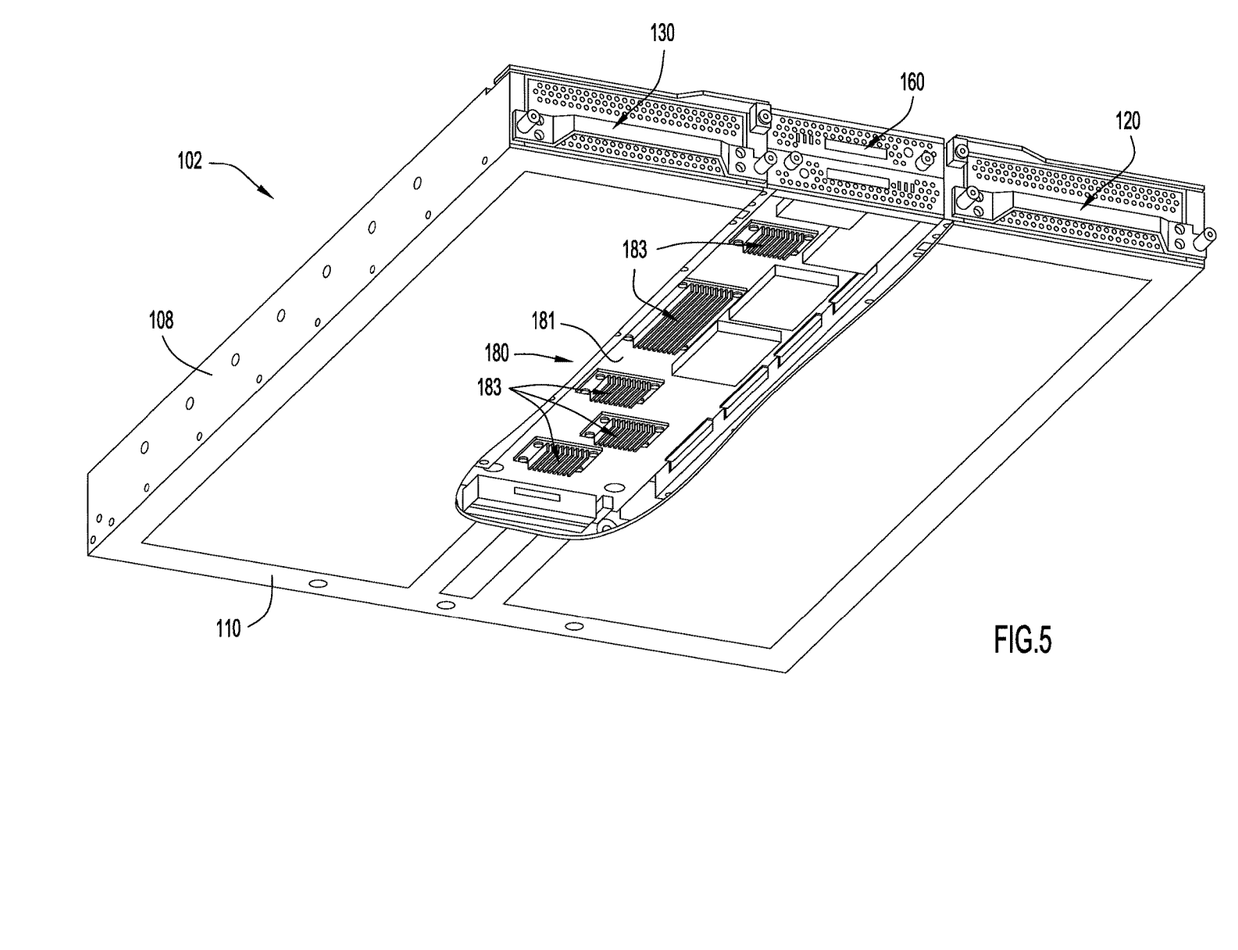
FIG. 5 illustrates a bottom perspective view of a portion of the storage drawer of FIG. 1, according to an example embodiment.

Referring now to FIG. 5 with continued reference to FIG. 4, the controllers 160 and 180 are shown stacked on top of each other, with one controller inverted with respect to the other. In the depicted embodiment, controller 160 is inverted and controller 180 is upright. As is described in detail below with respect to FIG. 6, each controller 160, 180 includes parts, modules, logic, etc. arranged on a panel 161, 181, respectively. In order to provide controllers with a 1/2U form factor, these components are distributed over the panels 161, 181 and short-fin heatsinks 163, 183 are provided to cool each of these panels 161, 181. By inverting the controllers 160, 180 with respect to each other, the heat sinks 163, 183 are each adjacent a portion of the housing 102 and, thus, more effectively configured to dissipate heat. In other words, inverting one of the redundant controllers 160, 180, as shown in FIGS. 4 and 5 allows the controllers 160, 180 to properly cool while in a stacked configuration that allows the storage blade 100 to fit within a 1U form factor.

Figure 6:
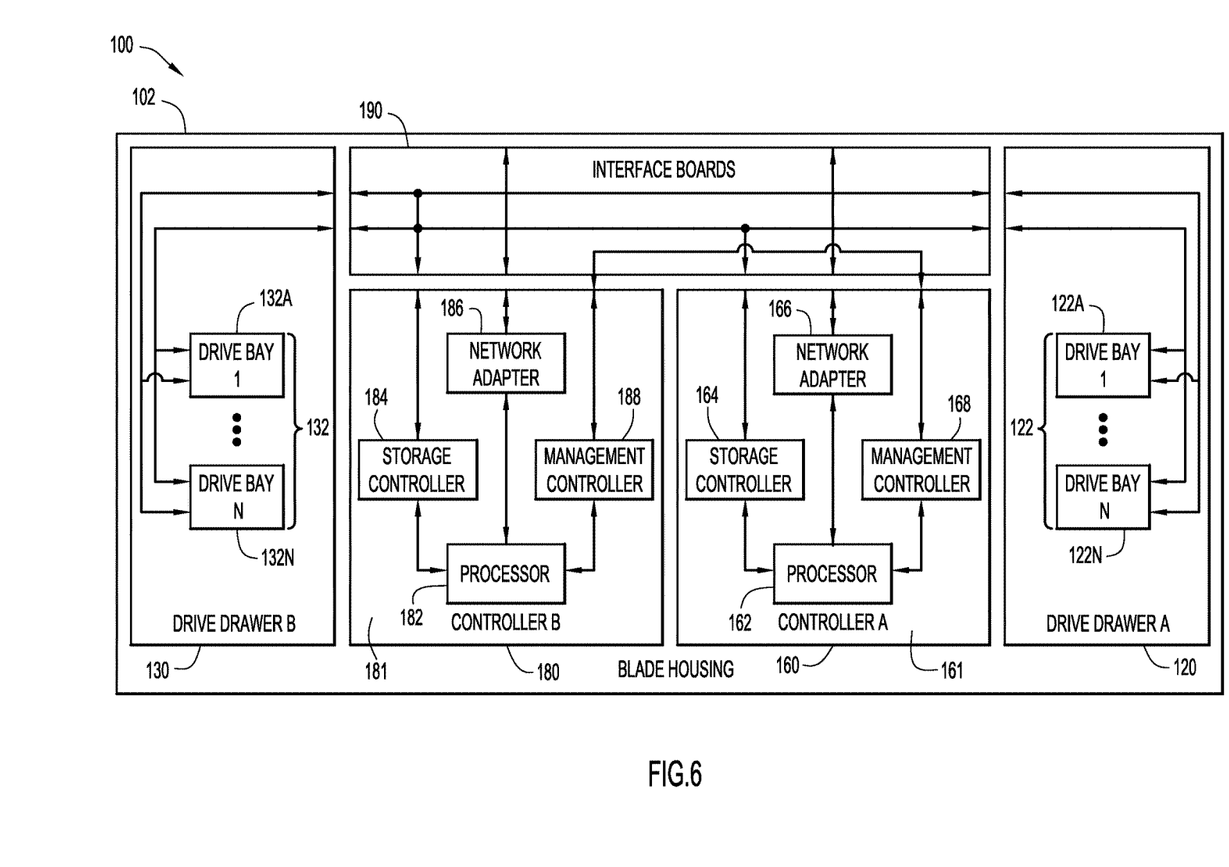
FIG. 6 is a block diagram of a storage blade with redundant controllers, according to an example embodiment.

Now referring to FIG. 6, a block diagram of a storage blade 100 according to an example embodiment is shown. As discussed above, the storage blade 100 includes a housing 102 that supports a first drive drawer 120, a second drive drawer 130, a first controller 160, and a second controller 180 that are operatively coupled together via an interface board 190. The first drive drawer 120 and second drive drawer 130 are movably secured to the housing 120 and each include a set of drive bays. The first drive drawer 120 includes a first set of drive bays 122, including any number of drive bays 122A-122N and the second drive drawer 130 includes a second set of drive bays 132, including any number of drive bays 132A-132N. As mentioned, in some embodiments, each set of drive bays 122, 132 includes eight drives; however, the arrangement of eight bays described above is not intended to be limiting. Generally, in order to provide enterprise grade reliability, the storage blade 100 may be configured to not draw more power than the maximum power that a blade chassis is designed to supply to a single full width slot. In some embodiments, this requires that the storage blade not draw more than 1200 W of power. Moreover, in some embodiments, all memory must run at 1333 MHz. Accordingly, the controllers 160, 180 may be configured to provide these specifications.

The first controller 160 and second controller 180 are redundant controllers and are each operatively coupled to any bays 122A-122N included in the first set of bays 122 and any bays 132A-132N included in the second set of bays 132, regardless of the number of bays included in the first set 122 and the second set 132. Since the controllers 160, 180 are redundant, if one controller 160, 180 malfunctions, the other controller 160, 180 may replicate the necessary control functions of the malfunctioning controller 160, 180. Moreover, since the first controller 160 and the second controller 180 are operatively coupled to all of the drives bays 122A-122N included in the first set of drive bays 122 and all of the drive bays 132A-132N included in the second set of drive bays 132, the first controller 160 and second controller 180 are redundant controllers with true dual-pathing to any drive installed in the drive bays 122A-122N, 132A-132N included in the storage blade 100.

The first controller 160 and second controller 180 include the same parts, modules, logic, etc. For example, in the embodiment depicted in FIG. 6, the first controller 160 includes a processor 162 that is operatively coupled to a storage controller 164, a network adaptor 166, and a management controller 168 and the second controller 180 also includes a processor 182 that is operatively coupled to a storage controller 184, a network adaptor 186, and a management controller 188. In some embodiments, the processor 162, the storage controller 164, the network adaptor 166, and the management controller 168 may be arranged on panel 161 in the same manner that the processor 182, the storage controller 184, the network adaptor 186, and the management controller 188 are arranged on panel 181. In other embodiments, the aforementioned components may be arranged in any desirable manner on panel 161 and 181, provided the controllers 160 can collectively fit into a 1U form factor slot when stacked on top of controller 180, such as in the manner shown in FIG. 7. However, regardless of how the aforementioned components are arranged, the same components are included in the first controller 160 and second controller. Consequently, each of the components from controller 160 is described below with the understanding that the description also applies to the corresponding part of controller 180.

In some embodiments, the processor 162 is an INTEL Gladden CPU—Ivy Bridge-based, embedded processors. However, in other embodiments, the processor 162 may be any processor, provided the processor 162 allows the controllers 160 to maintain a 1/2U form factor. Although not shown, the processor 162 may also be in communication with memory modules, such as dual in-line memory modules (DIMMs), including small outline DIMMs (SODIMMs) and non-volatile SODIMMs (NVDIMMs) in order to meet the processing requirements of the storage blade 100. For example, controller 160 may include 4 DIMM slots and may include two NVDIMM modules, including battery backed NVDIMM modules, and two SODIMM modules.

Airflow and cooling of these components should function normally without the need for blanking panels in IO cards or DIMM slots not occupied by actual components.

The controller 160 does not support adapter cards due to the form factor of the storage blade. Instead, the controller 160 may be coupled to all of the drive bays 122A-122N, 132A-132N included in the first drive drawer 120 and second drive drawer 130 via the storage controller 164. In some embodiments, the storage controller 164 includes or is coupled to an expander to enable the controller 160 to be connected to all of the drive bays 122A-N, 132A-N included in the storage blade 100 (and, thus, to be connected to any drive installed in the drive bays 122A-N, 132A-N). Moreover, in some embodiments, the storage controller 164 includes a bridge chip to provide multiplexing, if required. For example, each expander may be connected to a Serial Attached Small Computer System Interface (SAS) to SATA bridge chip that connects to the expander and allows each expander to connect to any SATA drive installed in the sets of bays 122, 132. For example, the storage controller 164 may be LSI 3008 I/O Controllers (IOC) and may include a LSI SAS2×24 SAS expander.

The controller 160 supports a LAN-on-Motherboard (LOM) network adaptor 186 for network input/output (TO) in order to provide redundant controllers 160 and 180 that fit into a 1U form factor (i.e., each controller has a 1/2U form factor). In some embodiments, the network adaptor 186 provides two 10 Gigabit Ethernet (GE) links to each input output module (TOM) per controller 160, 180 (40 GE total) and two 10 GE links between the first controller 160 and the second controller 180 (20 GE total). Moreover, in some embodiments, the network adaptor 166 may be coupled to the processor 162 via high-speed serial computer expansion bus; however, in other embodiments, the network adaptor 166 may be coupled to the processors 162 in any manner.

The management controller 168 may control power on/off sequences for the storage blade 100. In some embodiments, the management controller 168 may have the ability to stagger power up of drives 122A-122N and 132A-132N during boot and/or the ability to remotely bring up/shut down a server and have it remain in that state. Moreover, in some embodiments, the storage blade 100 may include sensors in all temperature-sensitive components as well as inlet/exhaust and the management controller 168 may be capable of real-time monitoring. The management controller 168 may communicate with drives installed in the drive bays 122A-122N and 132A-132N via the network adaptor 166 to read the fault status of the drives installed in the drive bays 122A-122N and 132A-132N. Additionally or alternatively, the management controller 168 may retrieve or determine other useful information, like drive temperatures and specific, measurable, attainable, realistic and timely (S.M.A.R.T.) data. For example, in some embodiments, the management controller 168 may query the drives, via network adaptor 166 to retrieve S.M.A.R.T. data.

Figure 7:
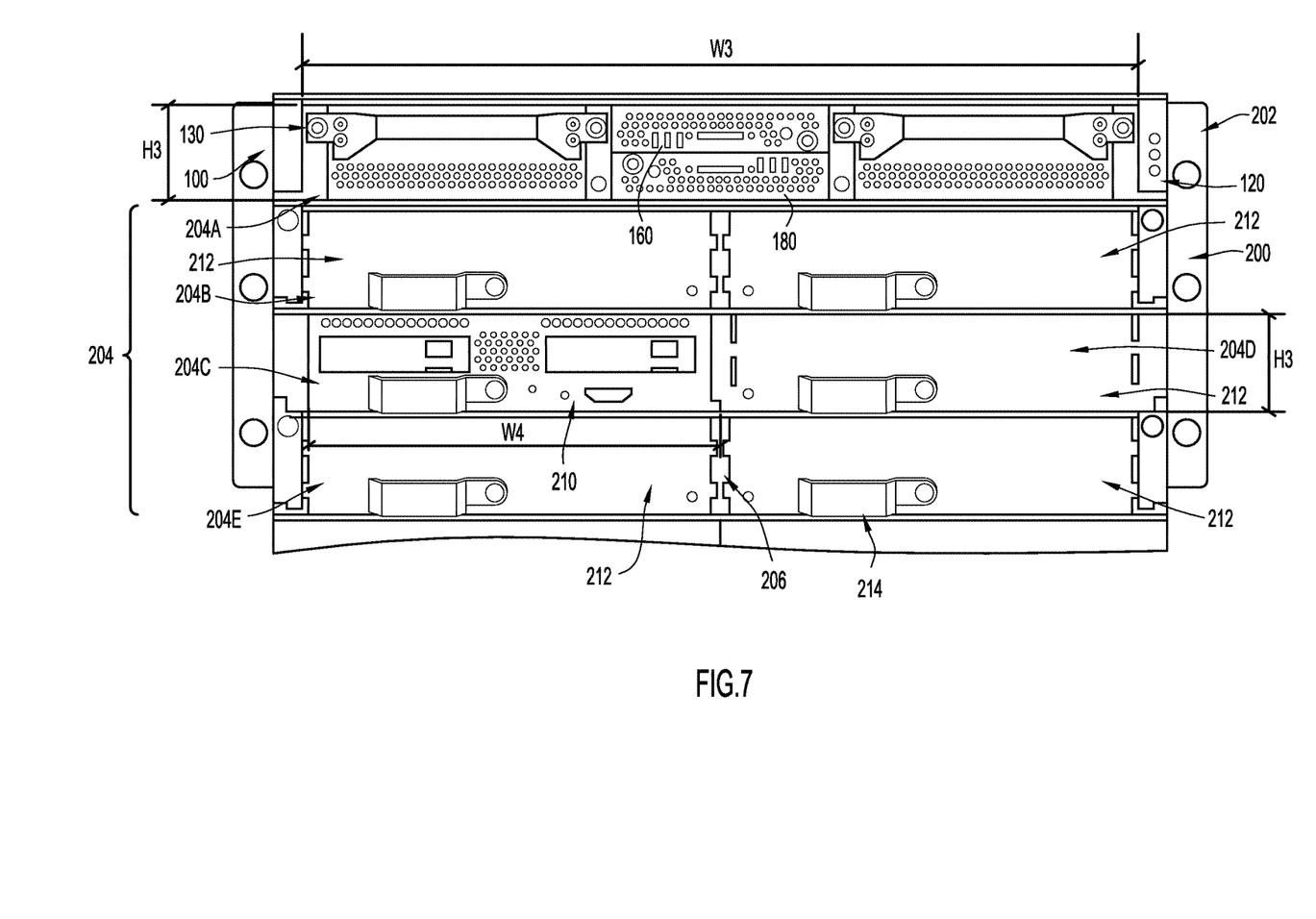
FIG. 7 illustrates a front perspective view of the storage blade of FIG. 1 installed in a blade enclosure, according to an example embodiment.

Referring now to FIG. 7, blade 100 is shown installed within in a blade enclosure 200, according to an example embodiment. The blade enclosure 200, which may be alternatively referred to as blade chassis 200, includes a frame 202 that defines a number of slots 204 within a receiving area 206 of the chassis 200. In different embodiments, the blade chassis 200 may include any number of slots 204 of any width (or height if the slots are vertically oriented); however, in the particular embodiment shown in FIG. 7, the chassis 200 includes slots 204A-204E and each of the slots 204A-204E is configured to receive blade components, such as server blades, storage blades, and switch blades. More specifically, each slot 204A-204E is a single rack unit slot (i.e., a 1U form factor) and, thus, has a height H3 (shown on slots 204A and 204C) that is approximately 1.75 inches high, and a width that either spans the full width W3 (slots 204A, 204B and 204E) of the receiving area 206 or a width W4 (slots 204C and 204D) that spans half of the receiving area 206. In this embodiment, the 1U form factor has a full width W3 that is approximately 19 inches wide; however, in other embodiments, a 1U form factor slot may be approximately 23 inches wide, or some other width.

The storage blade 100 is configured to fit in a full width 1U slot, like slot 204A (i.e., a slot that has a width W3 or equivalent height if oriented vertically). Thus, in the depicted embodiment, the storage blade 100 has a housing 102 with external dimensions configured to span a 19 inch slot width. However, since the width of slots 204A-204E may vary in different embodiments of chassis 200, the storage blade 100 may include a housing 102 with external dimensions configured to span a 1U slot of any width in different embodiments. By comparison, a server blade 210 may, in some embodiments, be configured to fit in a half-width slot, like slot 204C, that may be referred to as 1U half-rack slot.

Still referring to FIG. 7, but now with reference to FIGS. 1 and 2 again as well, when the housing 102 is configured to fit within a 1U slot, the first drive drawer 130 and the second drive drawer 120 span the height H1 of the internal cavity 112 of the blade housing 102 in the manner discussed above with regards to FIGS. 1 and 2 and, thus substantially span the height H3 of the slot 204 that the housing 102 is installed into. Similarly, the controllers 160, 180 are configured to collectively span the height H1 of the internal cavity 112 of the blade housing 102 and, thus, also substantially span the height H3 of the slot 204 that the housing 102 is installed into. Put another way, the controllers 160, 180 each have a height that spans approximately 1/2U height, so when the controllers 160, 180 are stacked atop of each other in the manner shown in FIG. 7, the controllers 160, 180 substantially span the height of the internal cavity 112 of a blade housing 102 that is configured to fit in a 1U slot. However, when installed in the chassis 200, the internal components of the chassis 200 may recognize that two controllers 160, 180 are present and each controller 160, 180 may appear as a half blade to the internal components of the chassis.

Any of the slots 204A-204E that do not have a blade component installed therein (e.g., slots 204B, 204D, and 204E) are covered with removable covers 212. In this embodiment, the covers 212 have a width W4 such that slots with a width W3 (such as slot 204B) are covered with a pair of covers 212 and slots with a width W4 can be covered with a single cover 212. Sizing the covers 212 in this manner allows the chassis 200 to receive blade components that have a width smaller than W3 without exposing an entire slot 204. Each cover 212 may include a handle 214 that facilitates installation and removal of the cover 212 from one of the slots 204. However, in other embodiments, the chassis 200 may or may not include covers 212 and the covers may be any size and may or may not be removable. Moreover, if the chassis 200 includes removable covers 212, the covers 212 may include features other than handles to facilitate removal and installation. In order to ensure that the storage blade 100 does not interfere with any of the covers 212, handles 214, or any other features of the chassis 200, no part or portion of the storage blade 100 should protrude beyond the standard blade ejector handle so as not to cause rack door interference, except when a drive drawer 120, 130 is in its extracted position P2, such as for drive servicing.

Although not shown, in some embodiments, the chassis 200 may be configured to provide external indicators related to the storage blade 100. For example, in some embodiments, the chassis 200 may provide external indicators related to drive and RAID status, fault detection, power, location, network activity, etc. Moreover, in some embodiments, the storage blade 100 may not include any external interfaces and the chassis 200 may handle all external IO traffic.

There are several advantages to the storage blade presented herein. Most notably, the storage blade presented herein fits within a single, 1U slot of a blade enclosure and, thus, maximizes the space available within the blade chassis for other blade components without expanding the overall footprint of the blade chassis. By comparison, other storage solutions for blade chasses are either substantially larger storage blades, such as 2U solutions, or sidecar solutions which piggyback on computer nodes without providing redundant controllers and, thus, fail to provide an enterprise grade solution while also expanding the footprint of a blade chassis. Moreover, the storage blade presented herein provides support for 16 drives in serviceable drive drawers, such that failing drives can be replaced without any system downtime, while also providing dedicated, redundant controllers to enable full High Availability (HA) without the need for a secondary system. By providing the aforementioned features in an enterprise grade storage appliance, the storage blade presented herein allows for increased flexibility in deployments, especially as compared to 2U solutions.

Still further, the unique combinations of compute and memories included in the storage blade included herein enables the controllers to have a 1/2U form factor and, thus, allows the storage blade presented herein to fit within a 1U form factor while providing the maximum amount of capacity and reliability possible. The design of the storage blade presented herein provides hot swappable drives, high availability through the use of redundant controllers, and may also provide data-loss prevention through the use of a custom non-volatile memory.

To summarize, in one form, a storage blade apparatus is provided comprising: a blade housing; a first drive drawer in the blade housing and including a first set of drive bays; a second drive drawer in the blade housing and including a second set of drive bays; at least first and second redundant controllers contained within the blade housing, wherein each of the first and second redundant controllers is operably connected to each of the drive bays included in the first set of drive bays and each of the drive bays included in the second set of drive bays; and wherein the blade housing is configured to fit within a blade slot of a chassis.

In another form, a system is provided comprising: a chassis including a number of slots; and a blade housing configured to fit into a single rack unit slot of the chassis and comprising: a first drive drawer including a first set of storage drives; a second drive drawer including a second set of storage drives; a first controller operatively coupled to the first set of storage drives and the second set of storage drives; and a second controller operatively coupled to the first set of storage drives and the second set of storage drives; wherein the first controller and the second controller are redundant.

In still another form, an apparatus is provided comprising: a housing including an internal cavity and external dimensions configured to fit within a slot of a chassis, the internal cavity having a height, a width, and a depth; a first drive drawer including a first set of drive bays, wherein the first drive drawer spans the height of the internal cavity and is movably coupled to the housing such that the first drive drawer is movable between a first inserted position and a first extended position, the first drive drawer being disposed within the internal cavity in the first inserted position and extending at least partially out of the internal cavity in the first extended position; a second drive drawer including a second set of drive bays, wherein the second drive drawer spans the height of the internal cavity and is movably coupled to the housing such that the second drive drawer is movable between a second inserted position and a second extended position, the second drive drawer being disposed within the internal cavity in the second inserted position and extending at least partially out of the internal cavity in the second extended position; and a pair of controllers disposed between the first drive drawer and the second drive drawer and within the internal cavity, each of the pair of controllers spanning half the height of the internal cavity, wherein a collective width of the first drive drawer, the second drive drawer, and one of the controllers spans the width of the internal cavity The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A storage blade apparatus comprising:
   a blade housing configured to fit within a single rack unit (1U) form factor blade slot of a chassis;
   a first drive drawer in the blade housing and including a first set of drive bays;
   a second drive drawer in the blade housing and including a second set of drive bays; and
   at least first and second redundant controllers contained within the blade housing, wherein each of the first and second redundant controllers is operably connected to each of the drive bays included in the first set of drive bays and each of the drive bays included in the second set of drive bays, and wherein the second controller is disposed on top of, and inverted with respect to, the first controller.

2. The apparatus of claim 1, wherein the 1U form factor blade slot is a full width 1U form factor blade slot.

3. The apparatus of claim 1, wherein the first controller and the second controller appear as a half blade to components in the chassis.

4. The apparatus of claim 1, wherein the first controller includes a first plurality of heat sinks, the second controller includes a second plurality of heat sinks, and the second controller is inverted with respect to the first controller so as to position the first plurality of heat sinks and the second plurality of heat sinks adjacent to the blade housing.

5. The apparatus of claim 1, wherein the first drive drawer is slidable between a first inserted position and a first extracted position, the second drive drawer is slidable between a second inserted position and a second extracted position, the first set of drive bays are accessible when the first drive drawer is in the first extracted position and the second drive set of drive bays are accessible when the second drive drawer is in the second extracted position.

6. The apparatus of claim 5, wherein the first set of drive bays and the second set of drive bays each include eight drive bays.

7. The apparatus of claim 5, wherein each of the at least first and second redundant controllers remains coupled to the first set of drive bays when the first drive drawer is in the first extended position and the second set of drive bays when the second drive drawer is in the second extended position.

8. The apparatus of claim 5, wherein the first drive drawer and the second drive drawer are individually slidable with respect to the first and second redundant controllers.

9. The apparatus of claim 1, wherein the apparatus is configured to run any memory at 1333 Mhz and configured to draw less than 1200 W of power.

10. The apparatus of claim 1, wherein each of the first and second redundant controllers further comprises:
    a storage controller operably coupled to any drives included in the first set of drive bays and the second set of drive bays;
    a network adaptor operably coupled to network components included in the chassis;
    a processor; and
    a management controller.

11. The apparatus of claim 1, further comprising:
    a light emitting diode (LED) controller configured to control LEDs associated with the first set of drive bays and the second set of drive bays based on feedback from the at least first and second redundant controllers and any drives included in the first set of drive bays and the second set of drive bays.

12. A system comprising:
    a chassis including a plurality of slots, at least one of which is a single rack unit (1U) form factor slot; and
    a blade housing configured to fit into the at least one 1U form factor slot of the chassis and comprising:
      a first drive drawer including a first set of storage drives;
      a second drive drawer including a second set of storage drives;
      a first controller operatively coupled to the first set of storage drives and the second set of storage drives; and
      a second controller operatively coupled to the first set of storage drives and the second set of storage drives;
      wherein the first controller and the second controller are redundant, and wherein the second controller is disposed on top of, and inverted with respect to, the first controller.

13. The system of claim 12, wherein each slot of the at least one 1U form factor slot has a slot width and a slot height, each controller has a controller height that is half the slot height, and the first drive drawer, the second drive drawer, and the third drive drawer collectively have width with equal to the slot width.

14. The system of claim 12, wherein the first controller includes a first plurality of heat sinks, the second controller includes a second plurality of heat sinks, and the second controller is inverted with respect to the first controller so as to position the first plurality of heat sinks and the second plurality of heat sinks adjacent to the blade housing.

15. An apparatus comprising:
    a housing including an internal cavity and external dimensions configured to fit within a single rack unit (1U) form factor slot of a chassis, the internal cavity having a height, a width, and a depth;
    a first drive drawer including a first set of drive bays, wherein the first drive drawer spans the height of the internal cavity and is movably coupled to the housing such that the first drive drawer is movable between a first inserted position and a first extended position, the first drive drawer being disposed within the internal cavity in the first inserted position and extending at least partially out of the internal cavity in the first extended position;

a second drive drawer including a second set of drive bays, wherein the second drive drawer spans the height of the internal cavity and is movably coupled to the housing such that the second drive drawer is movable between a second inserted position and a second extended position, the second drive drawer being disposed within the internal cavity in the second inserted position and extending at least partially out of the internal cavity in the second extended position; and a pair of controllers disposed between the first drive drawer and the second drive drawer and within the internal cavity, each of the pair of controllers spanning half the height of the internal cavity, wherein a first controller of the pair of controllers is disposed on top of, and inverted with respect to, a second controller of the pair of controllers, and wherein a collective width of the first drive drawer, the second drive drawer, and one of the controllers spans the width of the internal cavity.

16. The apparatus of claim 15, wherein the first drive drawer and the second drive drawer each span the depth of the housing when in the inserted position.

17. The apparatus of claim 15, wherein the 1U form factor slot is a full width, 1U form factor slot.

18. The apparatus of claim 15, wherein the pair of controllers are redundant controllers and each of the pair of controllers is operably coupled to any drives in the first set of drive bays or the second set of drive bays.

19. The apparatus of claim 15, wherein the first controller includes a first plurality of heat sinks, the second controller includes a second plurality of heat sinks, and the second controller is inverted with respect to the first controller so as to position the first plurality of heat sinks and the second plurality of heat sinks adjacent to the housing.

20. The apparatus of claim 15, wherein the first set of drive bays and the second set of drive bays each includes eight drive bays, each of the eight first drive bays is accessible when the first drive drawer is in the first extended position, and each of the eight second drive bays is accessible when the second drive drawer is in the second extended position.

* * * * *